United States Patent
Rueger et al.

(10) Patent No.: US 7,718,080 B2
(45) Date of Patent: May 18, 2010

(54) ELECTRONIC BEAM PROCESSING DEVICE AND METHOD USING CARBON NANOTUBE EMITTER

(75) Inventors: Neal R. Rueger, Boise, ID (US); Mark J. Williamson, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 761 days.

(21) Appl. No.: 11/503,690

(22) Filed: Aug. 14, 2006

(65) Prior Publication Data

US 2008/0038894 A1 Feb. 14, 2008

(51) Int. Cl.
*H01L 21/302* (2006.01)
*B82B 1/00* (2006.01)

(52) U.S. Cl. .............. 216/37; 216/59; 216/63; 216/67; 216/79; 216/80; 219/121.17; 219/121.2; 250/492.2; 250/492.3; 438/695; 438/706; 438/710; 438/719; 438/723; 438/758; 427/98.4

(58) Field of Classification Search .......... 216/65
See application file for complete search history.

(56) References Cited

U.S. PATENT DOCUMENTS

| | | | |
|---|---|---|---|
| 4,260,649 A | 4/1981 | Dension et al. | |
| 4,543,486 A | 9/1985 | Rose | |
| 4,579,750 A | 4/1986 | Bowen et al. | |
| 4,581,248 A | 4/1986 | Roche | |
| 4,624,736 A | 11/1986 | Gee et al. | |
| 4,655,849 A | 4/1987 | Schachameyer et al. | |
| 4,668,304 A | 5/1987 | Schachameyer et al. | |
| 4,670,063 A | 6/1987 | Schachameyer et al. | |
| 4,670,064 A | 6/1987 | Schachameyer et al. | |
| 4,685,976 A | 8/1987 | Schachameyer et al. | |
| 4,694,777 A | 9/1987 | Roche | |
| 4,832,781 A | 5/1989 | Mears | |
| 4,933,206 A | 6/1990 | Cox | |

(Continued)

FOREIGN PATENT DOCUMENTS

JP 09064030 A2 3/1997

(Continued)

OTHER PUBLICATIONS

Jonge, N., et al., "High brightness electron beam from a multi-walled carbon nanotube", *Nature* vol. 420, (Nov. 28, 2002), 393-395.

(Continued)

*Primary Examiner*—Anita K Alanko
(74) *Attorney, Agent, or Firm*—Schwegman, Lundberg & Woessner, P.A.

(57) ABSTRACT

Methods and devices for selective etching in a semiconductor process are shown. Chemical species generated in a reaction chamber provide both a selective etching function and concurrently form a protective coating on other regions. An electron beam provides activation to selective chemical species. In one example, reactive species are generated from a plasma source to provide an increased reactive species density. Addition of other gasses to the system can provide functions such as controlling a chemistry in a protective layer during a processing operation. In one example an electron beam array such as a carbon nanotube array is used to selectively expose a surface during a processing operation.

24 Claims, 5 Drawing Sheets

U.S. PATENT DOCUMENTS

| | | | |
|---|---|---|---|
| 4,938,996 | A | 7/1990 | Ziv et al. |
| 4,940,505 | A | 7/1990 | Schachameyer et al. |
| 4,980,198 | A | 12/1990 | Dowben et al. |
| 5,032,435 | A | 7/1991 | Biefeld et al. |
| 5,047,649 | A * | 9/1991 | Hodgson et al. .......... 250/492.2 |
| 5,102,830 | A | 4/1992 | Sandhu |
| 5,140,164 | A | 8/1992 | Talbot et al. |
| 5,155,053 | A | 10/1992 | Atkinson |
| 5,164,222 | A | 11/1992 | Gottsleben et al. |
| 5,326,981 | A | 7/1994 | Hara et al. |
| 5,387,443 | A | 2/1995 | Ota et al. |
| 5,403,433 | A | 4/1995 | Morrison et al. |
| 5,429,730 | A | 7/1995 | Nakamura et al. |
| 5,438,019 | A | 8/1995 | Sandhu |
| 5,472,935 | A | 12/1995 | Yandrofski et al. |
| 5,508,368 | A | 4/1996 | Knapp et al. |
| 5,622,567 | A | 4/1997 | Kojima et al. |
| 5,639,342 | A | 6/1997 | Chen et al. |
| 5,641,545 | A | 6/1997 | Sandhu |
| 5,648,114 | A | 7/1997 | Paz De Araujo et al. |
| 5,682,041 | A | 10/1997 | Kawakubo et al. |
| 5,733,609 | A | 3/1998 | Wang |
| 5,754,297 | A | 5/1998 | Nulman |
| 5,759,923 | A | 6/1998 | McMillan et al. |
| 5,800,617 | A | 9/1998 | Sandhu |
| 5,807,650 | A | 9/1998 | Komano et al. |
| 5,825,035 | A | 10/1998 | Mizumura et al. |
| 5,834,331 | A | 11/1998 | Razeghi |
| 5,942,854 | A | 8/1999 | Ryoji et al. |
| 5,976,328 | A | 11/1999 | Azuma et al. |
| 5,985,693 | A | 11/1999 | Leedy |
| 5,989,928 | A | 11/1999 | Nakata et al. |
| 6,051,287 | A | 4/2000 | Marsh |
| 6,064,800 | A | 5/2000 | Sandhu |
| 6,091,071 | A | 7/2000 | Franz et al. |
| 6,113,751 | A | 9/2000 | Morgenthaler |
| 6,143,085 | A | 11/2000 | Marsh |
| 6,177,147 | B1 * | 1/2001 | Samukawa et al. .......... 427/569 |
| 6,187,492 | B1 | 2/2001 | Ri et al. |
| 6,214,183 | B1 | 4/2001 | Maishev et al. |
| 6,281,072 | B1 | 8/2001 | Li et al. |
| 6,291,341 | B1 | 9/2001 | Sharan et al. |
| 6,309,972 | B1 | 10/2001 | Pio |
| 6,310,341 | B1 | 10/2001 | Todokoro et al. |
| 6,462,333 | B1 | 10/2002 | Gersonde |
| 6,499,425 | B1 | 12/2002 | Sandhu et al. |
| 6,573,199 | B2 | 6/2003 | Sandhu et al. |
| 6,613,702 | B2 | 9/2003 | Sandhu et al. |
| 6,661,005 | B1 | 12/2003 | Bruenger |
| 6,683,005 | B2 | 1/2004 | Sandhu et al. |
| 6,720,272 | B2 | 4/2004 | Sandhu et al. |
| 6,730,367 | B2 | 5/2004 | Sandhu |
| 6,753,538 | B2 | 6/2004 | Musil et al. |
| 6,764,856 | B2 | 7/2004 | Holmes et al. |
| 6,787,783 | B2 | 9/2004 | Marchman et al. |
| 6,793,736 | B2 | 9/2004 | Sandhu et al. |
| 6,797,337 | B2 | 9/2004 | Dando et al. |
| 6,809,317 | B2 | 10/2004 | Vandervorst |
| 6,811,615 | B2 | 11/2004 | Sun |
| 6,838,114 | B2 | 1/2005 | Carpenter et al. |
| 6,838,121 | B2 | 1/2005 | Weimer |
| 6,845,734 | B2 | 1/2005 | Carpenter et al. |
| 6,869,479 | B2 | 3/2005 | Shafeev et al. |
| 6,897,907 | B2 | 5/2005 | Morimitsu |
| 6,911,832 | B2 | 6/2005 | Kolachina et al. |
| 7,113,276 | B1 | 9/2006 | Higgs et al. |
| 7,122,125 | B2 | 10/2006 | Deshmukh et al. |
| 7,238,294 | B2 | 7/2007 | Koops et al. |
| 7,256,405 | B2 | 8/2007 | Nakasuji et al. |
| 7,262,555 | B2 * | 8/2007 | Rueger et al. .......... 315/111.21 |
| 7,303,690 | B2 | 12/2007 | Amemiya et al. |
| 7,311,947 | B2 | 12/2007 | Dando et al. |
| 7,452,477 | B2 | 11/2008 | Koops et al. |
| 7,569,484 | B2 | 8/2009 | Rueger et al. |
| 2002/0173124 | A1 | 11/2002 | Joo |
| 2002/0182542 | A1 * | 12/2002 | Choi et al. ................ 430/296 |
| 2003/0047691 | A1 | 3/2003 | Musil et al. |
| 2003/0170389 | A1 | 9/2003 | Sandhu |
| 2003/0201391 | A1 | 10/2003 | Shinada et al. |
| 2004/0036398 | A1 * | 2/2004 | Jin ............................ 313/309 |
| 2004/0048398 | A1 | 3/2004 | Liang et al. |
| 2004/0091638 | A1 | 5/2004 | Haight et al. |
| 2004/0097076 | A1 | 5/2004 | Iyer et al. |
| 2004/0113097 | A1 | 6/2004 | Marchman et al. |
| 2004/0124348 | A1 | 7/2004 | Utz et al. |
| 2004/0140437 | A1 * | 7/2004 | Bukofsky et al. ........ 250/492.3 |
| 2004/0151991 | A1 | 8/2004 | Stewart et al. |
| 2005/0078462 | A1 | 4/2005 | Dando et al. |
| 2005/0087514 | A1 | 4/2005 | Koops et al. |
| 2005/0212092 | A1 | 9/2005 | Nishizawa |
| 2005/0253093 | A1 * | 11/2005 | Gorski et al. .......... 250/492.22 |
| 2005/0266168 | A1 | 12/2005 | Poullos |
| 2006/0134920 | A1 | 6/2006 | Liang |
| 2006/0147814 | A1 | 7/2006 | Liang |
| 2006/0154477 | A1 | 7/2006 | Geng et al. |
| 2006/0183055 | A1 | 8/2006 | O'Neill et al. |
| 2006/0201911 | A1 | 9/2006 | Edelberg et al. |
| 2006/0228634 | A1 | 10/2006 | Bret et al. |
| 2006/0288937 | A1 | 12/2006 | Dando et al. |
| 2006/0289969 | A1 | 12/2006 | Dando et al. |
| 2007/0158303 | A1 | 7/2007 | Nasser-Ghodsi et al. |
| 2007/0158304 | A1 | 7/2007 | Nasser-Ghodsi et al. |
| 2007/0228002 | A1 | 10/2007 | Geng et al. |
| 2007/0228296 | A1 * | 10/2007 | Mouttet ................. 250/492.22 |
| 2007/0257212 | A1 * | 11/2007 | Mouttet ................. 250/492.22 |
| 2007/0278180 | A1 | 12/2007 | Williamson et al. |
| 2008/0006603 | A1 | 1/2008 | Williamson et al. |
| 2008/0006786 | A1 | 1/2008 | Williamson et al. |
| 2008/0009140 | A1 | 1/2008 | Williamson et al. |
| 2008/0038863 | A1 | 2/2008 | Rueger et al. |
| 2008/0038928 | A1 | 2/2008 | Rueger et al. |
| 2008/0038933 | A1 | 2/2008 | Rueger et al. |

FOREIGN PATENT DOCUMENTS

| | | |
|---|---|---|
| WO | WO-2008021363 A2 | 2/2008 |
| WO | WO-2008021363 A3 | 2/2008 |

OTHER PUBLICATIONS

Randolph, S., et al., "Focused electron-beam-induced etching of silicon dioxide", *Journal of Applied Physics, American Institute of Physics*. vol. 98, (Aug. 3, 2005), 34902-34902.

Teo, K., et al., "Fabrication and Electrical Characteristics of carbon nanotube-based microcathodes for use in a parallel elecron-beam lithography system", *Journal of Vacuum Science & Technology B: Microelectronics Processing and Phenomena*, vol. 21, (Mar. 2003), 693-697.

Abramo, M., et al., "Gas Assisted Etching: An Advanced Technique for Focused Ion Beam Device Modification", *Proceedings of the International Symposium for Testing Failure Analysis*, (Nov. 13, 1994), 439-446 pgs.

Abramo, M. T, et al., "The application of advanced techniques for complex focused-ion-beam device modification", *Reliability of electron devices, failure physics and analysis*, 1996. Proceedings of the 7th european symposium on Oct. 8-11, 1996, Piscataway, NJ, USA IEEE, (Oct. 8, 1996), 1775-1778 pgs.

Alers, G., et al., "Interlevel Dielectric Failure in Copper/Low-K Structures", *IEEE, Transactions on Devices and Material Reliability 36*, (2004), 148-152, Jun. 2004.

Fujii, Toshiaki, et al., "A nanofactory by focused ion beam", *Journal of Micromechanics and Microengineering*, 15(10), (2005), S286-S291, Sep. 6, 2005, online publ. date.

Fujioka, H., et al., "Measurements of the Energy Dependence of Electron Beam Assisted Etching of, and Deposition on, Silica", *Jour-* nal of Physics D. Applied Physics, IOP Publishing, Bristol, GB, vol. 23, No. 2, (Feb. 14, 1990), 266-268 pgs.

Golub, M., "Scanning electron microscope investigations of highly conducting organic composites", *Journal of Material Sciences 36*, (2001), 5543-5550.

Liao, J. Y, et al., "Etch characterization of packaged IC samples in an RIE with endpoint detection by ICP source for failure analysis applications", *Physical and failure analysis of integrated circuits, 2005, IPFA 2005. Proceedings of the 12th International Symposium on the Shangri-LA's RASA Sentosa Resort*, Singapore Jun. 27-Jul. 1, 2005 Piscataway, NJ, USA, IEEE, (Jun. 27, 2005), 123-126 pgs.

Marcoux, P. J, et al., "Methods of end point detection for plasma etching", *Solid State Technology, Pennwell Corporation*, Tulsa, OK, US, vol. 25, (Apr. 1981), 115-122 pgs.

Numajiri, T., et al., "Sample Preparation for electron beam testing with reactive ion etching", *Physical and Failure Analysis of Integrated circuits, 1997, Proceedings of the 1997 6th International Symposium on Singapore* Jul. 21-25, 1997, New York, USA, (Jul. 21, 1997), 56-61 pgs.

Sanchez, E. J, et al., "Ion and electron beam assisted growth of nanometric sl m on structures for near-field microscopy", *Review of scientific instruments, AIP*, Melville, NY, US, vol. 73, No. 11, (Nov. 2002), 3901-3907 pgs.

Wang, J, et al., "Etching characteristics of chromium thin films by an electron beam induced surface reaction", *Semicond. Sci. Technol.*, 18, (2003), 199-205, Feb. 10, 2003.

Wood, L., "Plasma Cleaning of Chip Scale Packages for Improvement of Wire Bond Strength", *IEEE, International Symposium on Electronic Materials and Packaging*, (2000), 406-408.

\* cited by examiner

ELECTRONIC BEAM PROCESSING DEVICE AND METHOD USING CARBON NANOTUBE EMITTER

TECHNICAL FIELD

This application relates generally to semiconductor devices and device fabrication and, more particularly, to surface processing using electron beams in various configurations to activate and/or stimulate surface processing.

BACKGROUND

Semiconductor processing is used to form structures and devices such as transistors, capacitors, etc. that in turn are used to form semiconductor memory chips, processing chips, and other integrated circuits. Semiconductor device uses range from personal computers, to MP3 music players, to mobile telephones. In the fabrication process of semiconductor structures and devices, techniques that are frequently used include material deposition processes, and material removal processes such as etching. By sequentially depositing and etching in selected regions on a semiconductor wafer, devices such as transistors, etc. are eventually formed.

As in any manufacturing process, reducing the time needed for a given manufacturing step or eliminating selected manufacturing steps reduces the cost of the final product. Selectively etching a semiconductor surface is a necessary step in most semiconductor processing operations. Selectivity can be obtained using a number of techniques, including use of a protective mask or using chemicals that selectively react with one material over another. Although techniques exist that provide some degree of selectivity, further improvements to processes that reduce time needed to complete a step, and/or eliminate processing steps are desired to further reduce cost. Improving selectivity also provides increased precision, allowing more detailed and/or smaller structure formation.

What is needed is an improved semiconductor processing method that addresses these and other concerns. What is also needed is a system to provide these methods and other processing needs. Also needed are inexpensive and high precision components formed by improved processing methods.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and chemical, structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is understood to include semiconductor on insulator wafers such as silicon-on-insulator (SOI). The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors.

Figure 1:
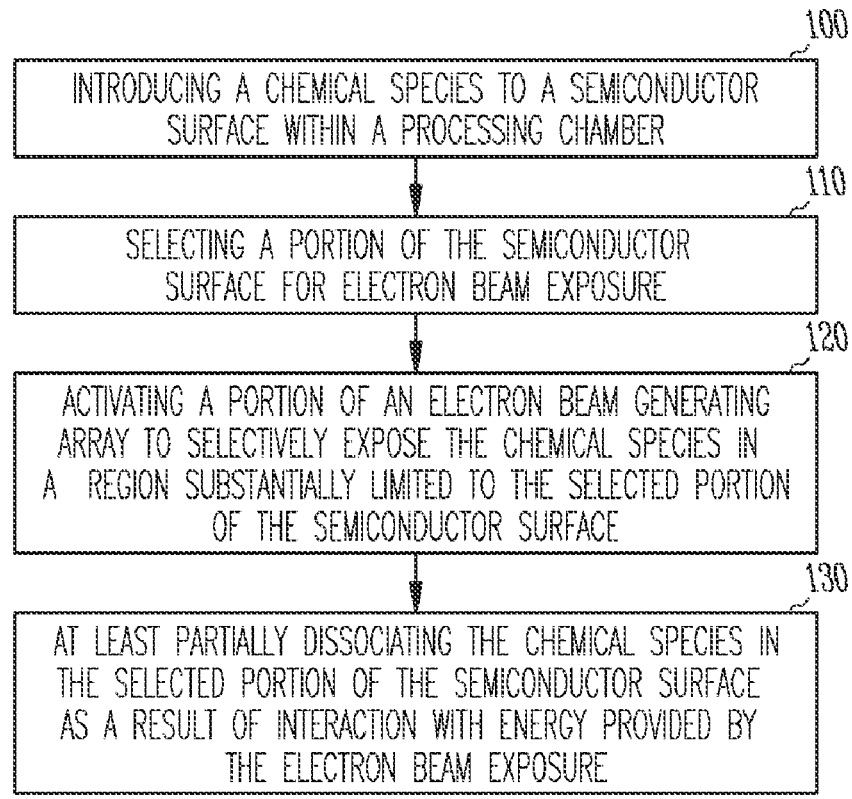
FIG. 1 shows a method flow diagram of semiconductor processing according to an embodiment of the invention.

FIG. 1 shows a flow diagram with a method of semiconductor surface processing according to one embodiment of the invention. In step 100, a semiconductor surface is included within a processing chamber, and a chemical species is introduced. Examples of chemical species include, but are not limited to, gasses, plasmas, etc. In one embodiment, the semiconductor surface includes one or more semiconductor wafers. One processing chamber includes an in-line production chamber where wafers are passed from station to station in a vacuum. In one embodiment, a processing chamber includes a chamber of a scanning electron microscope (SEM) as will be discussed in more detail below.

In one embodiment, a plasma is included in the chamber along with a gas source. In one embodiment only a plasma source such as a remote plasma generator is used. In one embodiment only a gas source is used. One of ordinary skill in the art having the benefit of the present disclosure will recognize that a portion of a plasma generated from a remote plasma source may recombine in the reaction chamber. In such an example, plasma species will be present in the reaction chamber along with non-plasma gas species. In one embodiment, the selected chemical species is capable of etching a region of the semiconductor surface. In addition, in one embodiment, the chemical species included in the reaction chamber are capable of dissociating into one or more species that are capable of etching a region of the semiconductor surface. For example, chemical species are chosen in one embodiment to dissociate when exposed to energies supplied by an electron beam, including, but not limited to a beam in a SEM. In one embodiment, the chemical species includes a halogen species. Examples of halogens include fluorine, chlorine, bromine, iodine, and astatine. In one embodiment, the chemical species further includes carbon. One example of a species that includes carbon and fluorine as a halogen include $CF_4$. In one embodiment, the chemical species includes other species such as hydrogen or another element. One example of a gas including hydrogen is $CHF_3$. In one embodiment, other species in addition to carbon and a halogen include multi-component species such as a carbon and hydrogen chain, or other combination of elements.

In step 110, the semiconductor surface and chemical species adjacent to the surface are exposed to an electron beam. As discussed above, in one embodiment, the electron beam is generated by an electron beam source in an electron microscope such as a SEM. In one embodiment, the electron beam source includes a carbon nanotube source. Carbon nanotube sources include an advantage of higher beam density and smaller spot size. Increased beam density provides more potential activation energy to react with chemical species as discussed below. Further, a smaller spot size allows higher precision in directing the electron beam to only a specific region of the semiconductor surface. In SEM embodiments, a smaller spot size also provides higher imaging resolution.

In a SEM embodiment, the electron beam can be focused using electromagnetic lenses. In one embodiment, the SEM configuration also provides a system to scan the electron beam over an area of the substrate. In one embodiment, such as a SEM embodiment, an imaging system is further included. In one embodiment, an imaging system includes devices such as a secondary electron detector.

One advantage of a SEM configuration includes the ability to focus and scan on only a selected portion of the substrate such as a semiconductor wafer. Another advantage of a SEM configuration includes the ability to concurrently image the selected portion of the surface being exposed to the electron beam. The ability to image allows a user to easily select the region to be exposed to the electron beam from the bulk of the semiconductor surface.

In one embodiment, a material composition detection system is further included. Examples of material composition detection systems include, but are not limited to x-ray detection systems, Fourier transform infrared (FTIR) detection systems, mass spectrometers, etc. In one embodiment, a material composition detection system is used to quantify composition of a coating that is grown in conjunction with electron beam interaction. Growth of such coatings will be discussed in more detail below.

Although an electron microscope is used as an example of an electron beam source, the invention is not so limited. Other embodiments include an electron beam source without additional microscope elements such as lenses, rastering systems, secondary electron detectors, etc. In one embodiment, the electron beam source includes an array of electron beam sources with selectable regions of electron beams. In one embodiment, one or more regions of the array can be varied to include different electron beam energies, or no electron beams in selected regions only. In one embodiment, an array of electron beam sources includes a carbon nanotube array with associated circuitry to select numbers of individual nanotubes within the array.

An advantage of electron beam array embodiments includes further ability to selectively process one region of a semiconductor surface while concurrently or sequentially processing an adjacent region in a different manner. One example includes providing electron beam energy to a first region sufficient to etch the surface of the first region while providing a different electron beam energy or absence of electron beam energy to a second region to grow a protective layer over the second region. As discussed above, in step 120, a portion of an electron beam array is activated to expose the chemical species only in a selected region. In selected embodiments, other energetic beams such as neutron beams, x-rays, etc. are used to provide energy appropriate to dissociate the chosen chemical species. Energetic beams such as electron beams provide an advantage in selected embodiments because they cause minimal damage to the workpiece in contrast to ion beams or other particle beams that may cause sputtering or other surface damage.

In step 130, the chemical species is at least partially dissociated into a number of reactive species. In one embodiment, the energy from the electron beam or electron beam array provides at least a portion of the energy necessary to dissociate the gas into the number of reactive species. The exact composition of the species will depend on the gas that is used. For example $CF_4$ gas will dissociate into a number of species such as $CF_3$, $CF_2$, and CF. One of ordinary skill in the art, having the benefit of the present disclosure will recognize that the energy of the electron beam can be adjusted to more effectively dissociate the species depending on the specific chemistry chosen.

In one embodiment, the chemical species is chosen such that the reactive species selectively etch a specific material on the semiconductor surface. In one embodiment, the reactive species are chosen to etch silicon dioxide. In one embodiment, the reactive species generated from the plasma source and/or the electron beam interaction does not etch a second material such as silicon. In one embodiment, a selective reaction such as etching is determined by a large difference in reaction rate. Although a reaction may be described as occurring on one material and not on another, in one embodiment, the reaction may occur on both materials, however a substantial difference in reaction rate is observed.

In selected embodiments, a coating is deposited on a region of the semiconductor surface, while concurrently an etching reaction is occurring on another region of the semiconductor surface. One example includes a silicon dioxide region that is adjacent to a silicon region. In one embodiment, a coating is deposited on the silicon region while the silicon dioxide region is etched at substantially the same time. Further, in one embodiment, a coating is deposited on the silicon dioxide region while the silicon region is etched at substantially the same time. Although silicon and silicon dioxide are used as examples, the invention is not so limited. Other semiconductor processing materials can be selectively etched or coated using appropriate reactive species chemistry that will be appreciated by one of ordinary skill in the art, having the benefit of the present disclosure. Examples of other semiconductor materials include, but are not limited to nitride materials, spin on glass materials, or other semiconductors such as germanium, or gallium arsenide, etc.

In one embodiment, a deposited coating includes a carbon containing coating. In one embodiment, the coating includes an amount of halogen. Using such an example, the coating can be characterized using a ratio of halogen to carbon.

Figure 2A:
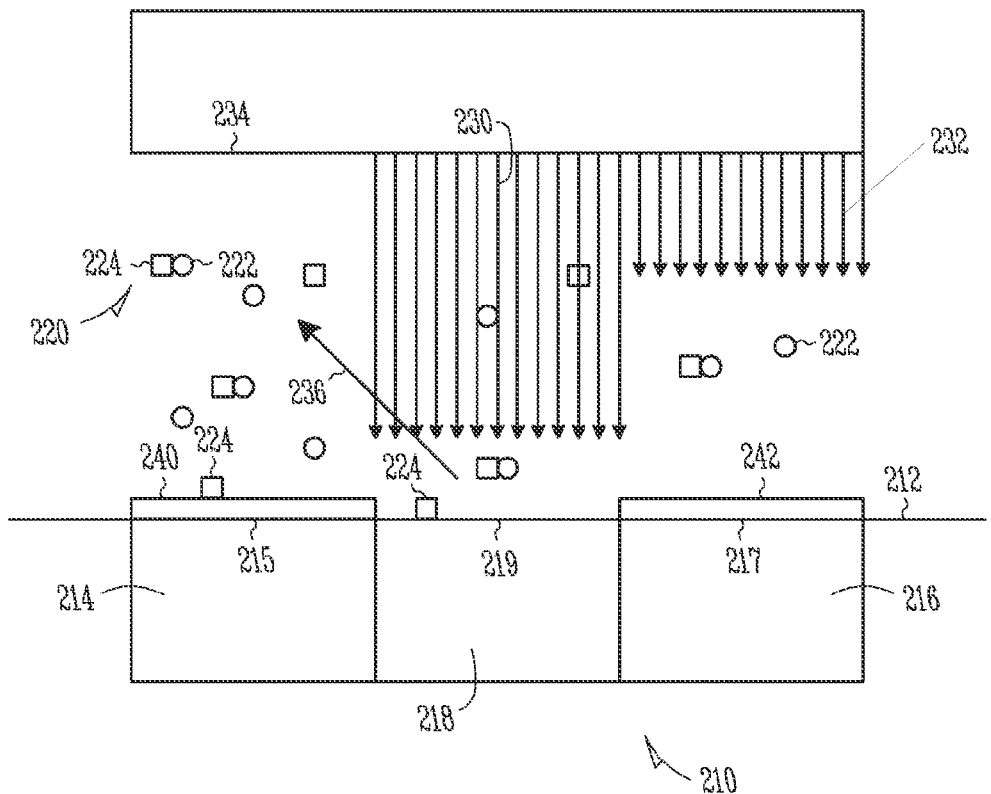
FIG. 2A shows a side view surface diagram of semiconductor processing according to an embodiment of the invention.

FIG. 2A illustrates one example of a method using some of the examples listed above. A chemical species 220 is shown in a reaction chamber over a substrate 210. The chemical species 220 can be generated by a plasma source such as a remote plasma generator. In one embodiment, the chemical species 220 includes a gas. Although for illustration purposes one form of chemical species 220 is shown in FIG. 2A, the invention is not so limited. In one embodiment, the reaction chamber includes two or more different species. In one example, the reaction chamber includes species generated by a plasma source and gas species from a different gas source. In one embodiment, one or more of the chemical species 220 are capable of reacting with the substrate and/or an electron beam energy source.

In one embodiment, the chemical species 220 includes $CHF_3$. In one embodiment, the substrate 210 includes a semiconductor wafer. A first silicon region 214 and a second silicon region 216 are shown with a silicon dioxide region 218 located adjacent to the silicon regions 214, 216.

A plurality of electron beams 230 of a first energy 230 (energy indicated by arrow length) is shown directed at the substrate 210. In one embodiment, the plurality of electron beams 230 are generated by an electron beam generating array 238. Additional particles 236 are shown that are generated as a result of the electron beams 230 interaction with the surface of the substrate 210. Additional particles 236 include, but are not limited to secondary electrons and backscattered particles. In one embodiment, additional particles 236 are used for material characterization.

Also shown in FIG. 2A are a second plurality of electron beams 232 generated by the electron beam generating array 238. As indicated by the arrow length, the first plurality of electron beams 230 have a different energy level than the second plurality of electron beams 232. In one embodiment, the first plurality of electron beams 230 are of a higher energy level than the second plurality of electron beams 232. In other embodiments, the second plurality of electron beams 232 are of a higher energy level than the first plurality of electron beams 230. Further shown in FIG. 2A is a selected region 234 of the electron beam generating array 238 where no electron beams are generated. By controlling the regions and energy levels or absence of electron beams, selected processing over a semiconductor surface is accomplished.

FIG. 2A illustrates the chemical species 220 as including a first subspecies 222 and a second subspecies 224. The illustration of two subspecies is used as an example only. In various embodiments, the chemical species 220 can be broken down into more than two subspecies. In one embodiment, the chemical species 220 reacts with the electron beam 230 and is dissociated into the first subspecies 222 and the second subspecies 224.

FIG. 2A shows the second subspecies 224 etching a surface 219 of the silicon dioxide region 218. Also shown are a first coating 240 on a top surface 215 of the first silicon region 214, and a second coating 242 on a top surface 217 of the second silicon region 216. In a separate reaction, one of the subspecies also forms the coatings. For example, the second subspecies 224 is shown in FIG. 2 forming the first and second coatings 240, 242.

Using $CHF_3$ gas as a gas species 220 example, a first subspecies example includes HF and a second subspecies includes $CF_2$. In the example, the $CF_2$ subspecies reacts with $SiO_2$ to form $SiOF_x$ and $CO_x$ byproducts and the $SiO_2$ surface, such as surface 219 in FIG. 2, is etched in the reaction. Further, in the example, the $CF_2$ subspecies deposits a coating on Si surfaces such as surfaces 215 and 217 of FIG. 2. In one embodiment, the coating is deposited in a polymerization reaction. An advantage of using a carbon and halogen containing gas includes the ability to both etch and deposit a coating concurrently. Specifically with $SiO_2$ and Si surfaces present, the carbon is needed in the chemical reaction to etch $SiO_2$ and the carbon further provides material to form the coating.

In one embodiment, an etching region such as surface 219 is exposed to electron beams from the electron beam generating array 238 of a first energy while a depositing region such as surface 217 is exposed to either no electron beams, or electron beams of a different energy than the etching region. One advantage of this configuration includes the ability to promote different chemical reactions concurrently in adjacent surface regions. For example, electron beams can be used to promote etching in one region and coating deposition in another region as shown in FIG. 2A.

An advantage of forming a coating concurrent to etching includes the ability to further enhance selectivity in an etching operation. In one embodiment, the coating serves as a sacrificial coating, and further protects the coated surface from etching. As discussed above, in one embodiment, selective etching is defined as a large difference in etch rate, with a material such as silicon etching, but at a much slower rate than another adjacent material such as silicon dioxide. The presence of a coating further reduces or eliminates any etching of the non selected material. Enhanced selectivity provides a number of advantages including the ability to form more detailed structures with sharper edge profiles, etc.

As mentioned above, in one embodiment, the coating contains both carbon and an amount of halogen such as fluorine. In one embodiment, a ratio of halogen to carbon is controlled to tailor the chemical and physical properties of the coating. Controlling the coating chemistry further enhances desired properties such as selective etching. For example, materials with a lower ratio of halogen to carbon provide better resistance to etching. In one embodiment, the ratio of halogen to carbon in the coating is controlled by further introducing a scavenger gas to the reaction chamber. In one embodiment, the scavenger gas is chosen to react with the halogen to form a byproduct gas that is removed from the reaction chamber by the vacuum system. In this way, the amount of halogen is reduced in the coating.

In one embodiment, the scavenger gas includes hydrogen gas ($H_2$). In a carbon-fluorine gas example, hydrogen forms HF gas, and thus reduces the amount of fluorine available in the chamber to form in the coating. In one embodiment, a scavenger gas is introduced to remove other species. For example, if it is desirable to have a high ratio of halogen to carbon in a coating, a scavenger gas such as $O_2$ can be introduced to preferentially remove carbon from the system, forming $CO_x$ gasses.

In one embodiment, a noble gas is further introduced to the system. Examples of noble gasses includes helium, neon, argon, krypton, xenon, and radon. In one embodiment, the addition of a noble gas further enhances the dissociation of the gas species 220 from FIG. 2A in addition to the dissociation provided by one or more of the electron beam 230 or 232. One mechanism of enhanced dissociation from noble gasses includes electron attachment dissociation.

Figure 2B:
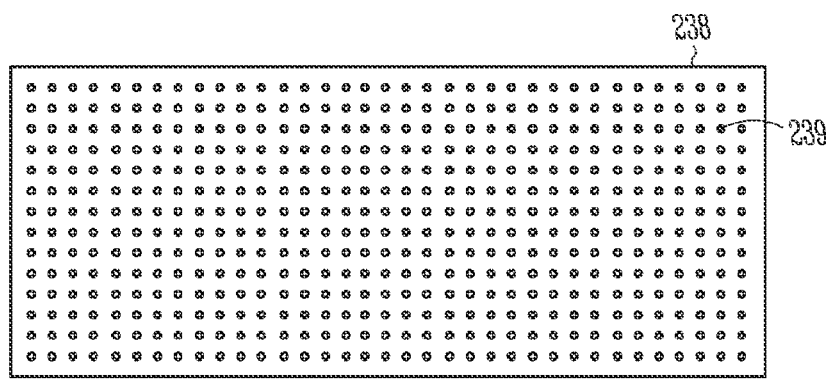
FIG. 2B shows an end view of an electron beam generating array according to an embodiment of the invention.

FIG. 2B shows a block diagram view of the electron beam generating array 238. A plurality of individual electron beam sources 239 are shown within the array 238. Circuitry is associated with the array (not shown) to selectively activate one or more of the individual electron beam sources 239 in the array. In one embodiment, selected individual electron beam sources 239 are activated to form a pattern of exposure on a surface such as a semiconductor surface. In one embodiment, the individual electron beam sources 239 include carbon nanotube sources. As discussed above, advantages of carbon nanotube sources include high beam density and decreased beam spot size.

Figure 3:
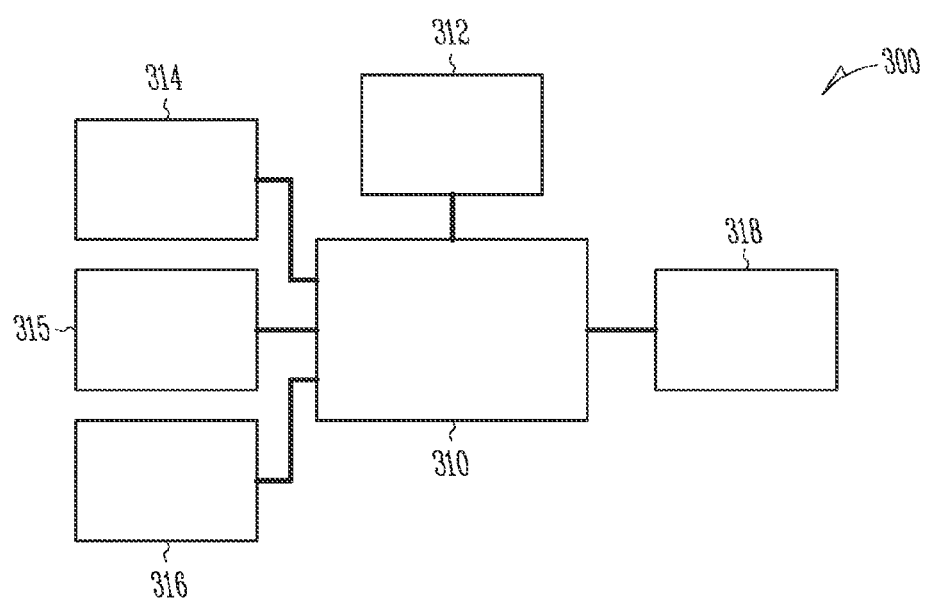
FIG. 3 shows a block diagram of a semiconductor processing system according to an embodiment of the invention.

FIG. 3 shows a block diagram of a semiconductor processing system 300. The system 300 includes a reaction chamber 310 with an electron beam source 312 coupled to the chamber 310. In one embodiment, the electron beam source 312 includes a focused scanning electron beam source such as provided in an SEM. A vacuum pump 318 is shown coupled to the reaction chamber 310. One of ordinary skill in the art having the benefit of the present disclosure will recognize that a number of possible vacuum pumps such as mechanical pumps, turbo pumps, etc. are within the scope of the invention.

A gas supply 316 is shown coupled to the reaction chamber 310. In one embodiment, the gas supply 316 provides one or more gas species in selected amounts. One gas includes a gas species to dissociate into etching and coating species. In selected embodiments, the gas supply also provides additional gasses such as scavenger gasses and/or noble gasses as discussed in embodiments above. In one embodiment, the gas supply includes controlling mechanisms and circuitry to function as an atomic layer deposition (ALD) system. For example, selected gasses can be supplied in pulses, and purge gasses or evacuation steps can be included between gas pulses. One of ordinary skill in the art having the benefit of the present disclosure will recognize that ALD gas choice depends on the chemistry of the surface where layer deposition is desired.

In one embodiment, a plasma source 315 such as a remote plasma source is coupled to the reaction chamber 310. In one embodiment, the remote plasma source 315 provides a chemical species as discussed above to dissociate into etching and coating species.

In one embodiment, a detector 314 is further included in the system 300, such as a secondary electron detector. In one embodiment, the detector 314 is used to provide imaging capability to the system 300 such as in a scanning electron microscope configuration. In one embodiment, other detection capability is also included in detector 314 such as detection of elemental composition.

Figure 4:
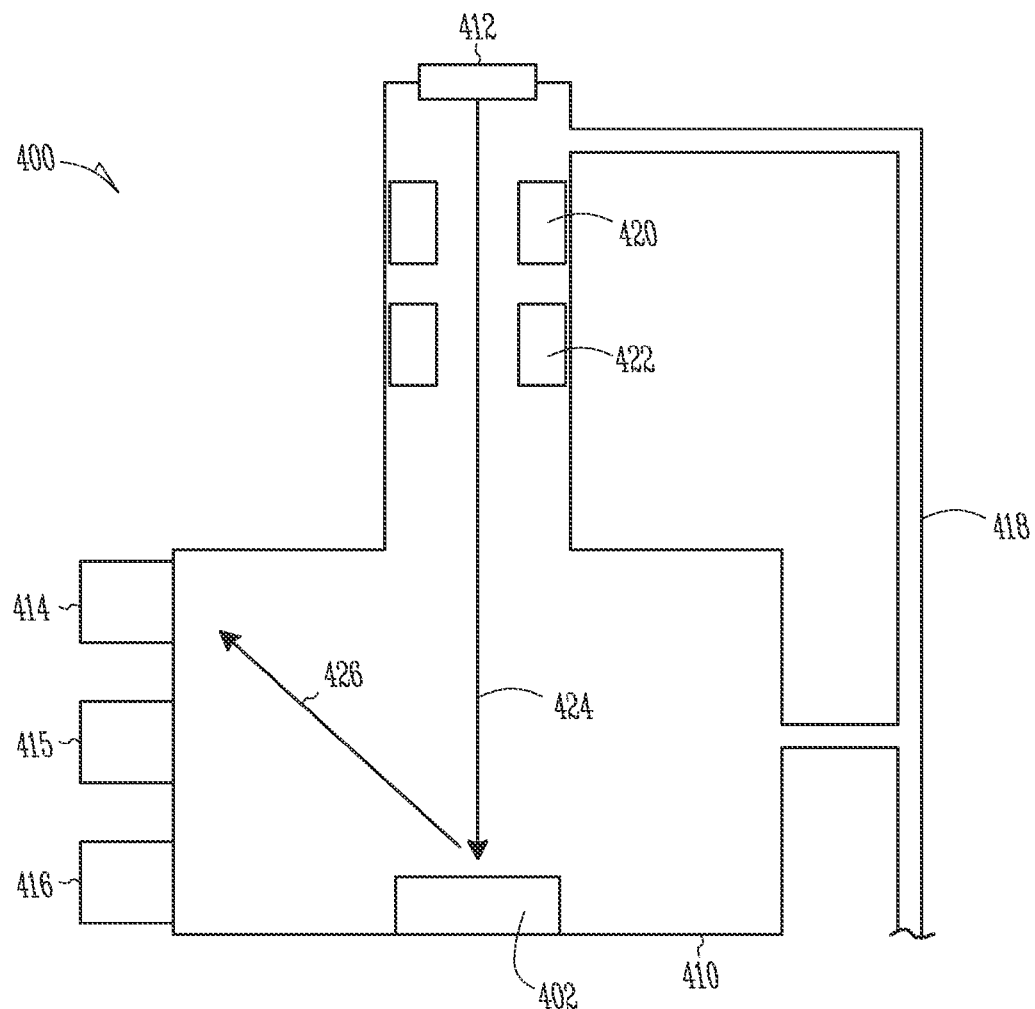
FIG. 4 shows another diagram of a semiconductor processing system according to an embodiment of the invention.

FIG. 4 shows a more detailed diagram of a system 400 similar to the system 300 shown in FIG. 3. The example system 400 in FIG. 4 includes a scanning electron type system 400 according to an embodiment of the invention. A processing chamber 410 is shown with a workpiece 402. As discussed above, in one embodiment, the workpiece includes a semiconductor device, chip, or other component. A conduit 418 or other connection is shown coupling the system 400 to a vacuum device (not shown). An electron source 412 is included in the system 400 to generate an electron beam 424 directed at a surface of the workpiece 402. In one embodiment, the electron source 412 includes a carbon nanotube source. Advantages of carbon nanotube sources include increased beam density and higher imaging resolution as discussed above. In one embodiment, a beam focusing lens device 420 is included to focus the electron beam 424. In one embodiment, a scanning device 422 is further included to raster, or otherwise scan a surface of the workpiece 402 with the beam 424.

In one embodiment, the electron source 412 includes an electron beam generating array similar to embodiments discussed above. One example includes a carbon nanotube array. Selected embodiments using an electron beam generating array do not include scanning devices, and rather operate by actuating individual electron beam sources within the array to selectively expose portions of the workpiece surface to beams of various energies.

A detector 414 is shown coupled to the system 400. In one embodiment, the detector 414 includes a secondary electron detector as described above to detect secondary electrons 426 as shown in the Figure. In one embodiment, the detector 414 includes other detecting capability such as Fourier transform infrared (FTIR) detection systems, mass spectrometers, etc. for detecting and quantifying material composition.

A gas source 416 is shown coupled to the reaction chamber 410. As discussed in selected embodiments above, an example of a gas supplied by the gas source 416 includes a gas species to dissociate into one or more species that provide etching and coating. In one embodiment, one dissociated species both etches one region and coats another region. In selected embodiments, the gas source 416 provides gasses such as scavenger gasses and/or noble gasses as discussed in embodiments above. Specific gasses include, but are not limited to, $H_2$, $O_2$, noble gasses, and carbon and halogen gasses such as $CHF_3$. In one embodiment, a tube or other directing structure 417 is included to better direct the gas or gasses over the workpiece 402.

A plasma source 415 such as a remote plasma source is also coupled to the reaction chamber 410 in one example. In one embodiment, the remote plasma source 415 provides a chemical species as discussed to dissociate into one or more species that provide etching and coating. In one embodiment, one dissociated species both etches one region and coats another region. One advantage of systems that include both a gas source and a plasma source includes increased density of reactive species. Systems with both a plasma source and an electron beam activated species can generate reactive species from the plasma, as well as through interactions with the electron beam.

Further, in selected chemical systems, reactive species may be unstable, and recombine before reacting with the workpiece surface 402. In one embodiment, an electron beam interaction helps maintain a density of reactive species provided by a plasma source.

Methods of processing semiconducting wafers, semiconductor devices, IC's, surface, etc. including electron beam techniques as described above may be implemented into a wide variety of electronic devices. Embodiments of these devices may include semiconductor memory, telecommunication systems, wireless systems, and computers. Further, embodiments of electronic devices may be realized as integrated circuits.

Figure 5:
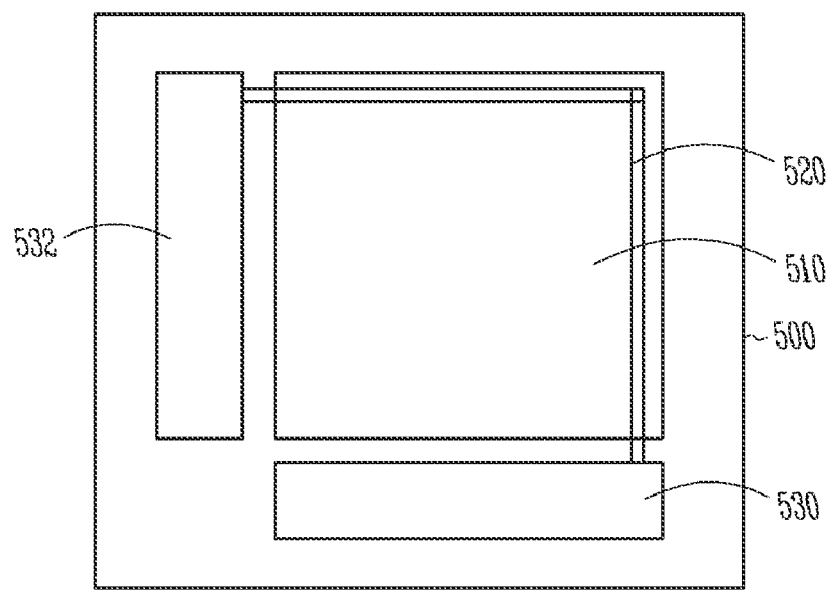
FIG. 5 shows a block diagram of a semiconductor memory according to an embodiment of the invention.

FIG. 5 illustrates an example of a semiconductor memory 500 formed using methods and devices described above. The memory 500 includes an array of memory cells 510 such as dynamic random access memory (DRAM) cells, or flash memory cells. A first sense amplifier 530 is included in one embodiment. A second sense amplifier 532 is included in one embodiment. Circuitry 520 is coupled between cells in the array 510 and one or more sense amplifiers to detect the state of selected cells.

Figure 6:
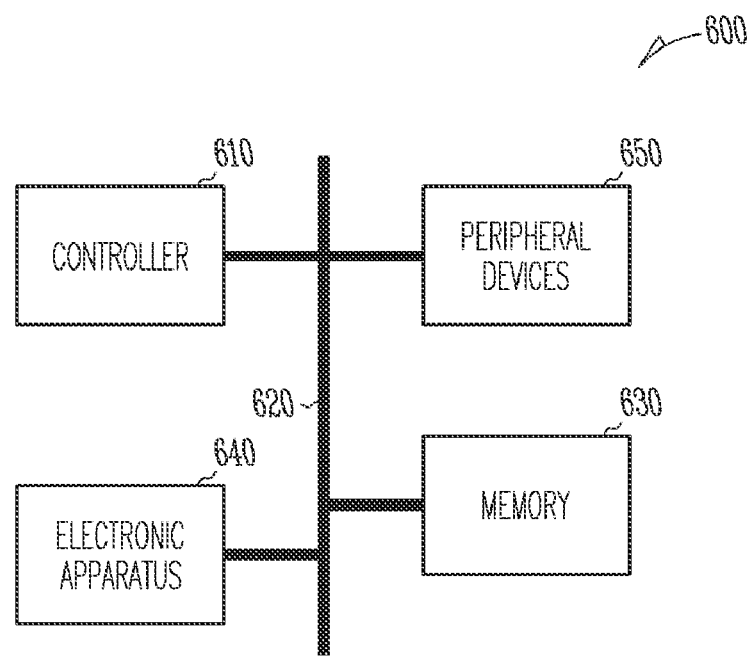
FIG. 6 shows a block diagram of an electronic system according to an embodiment of the invention.

FIG. 6 depicts a diagram of an embodiment of a system 600 having a controller 610 and a memory 630. The controller 610 or memory 630 may include structures formed by processes in accordance with the teachings herein. System 600 also includes an electronic apparatus 640 and a bus 620, where bus 620 provides electrical conductivity between controller 610 and electronic apparatus 640, and between controller 610 and memory 630. Bus 620 may include an address, a data bus, and a control bus, each independently configured. Alternatively, bus 620 may use common conductive lines for providing address, data, or control, the use of which is regulated by controller 610. In one embodiment, electronic apparatus 640 may be additional memory configured similar as memory 630. An embodiment may include an additional peripheral device or devices 650 coupled to bus 620. In one embodiment, the controller 610 is a processor. In one embodiment, the controller 610 is a processor having a memory. Any of controller 610, memory 630, bus 620, electronic apparatus 640, and peripheral device devices 650 may include structures formed by processes as described in selected embodiments above. System 600 may include, but is not limited to, information handling devices, telecommunication systems, and computers.

Peripheral devices 650 may include displays, additional storage memory, or other control devices that may operate in conjunction with controller 610. Alternatively, peripheral devices 650 may include displays, additional storage memory, or other control devices that may operate in conjunction with the controller 610 or memory 630, etc.

Memory 630 may be realized as a memory device containing structures formed by processes in accordance with various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method of semiconductor processing, comprising:
   introducing a chemical species to a semiconductor surface within a processing chamber;
   activating a first portion of an electron beam generating array to selectively provide a first electron beam energy to the chemical species in a first region of the semiconductor surface;
   activating a second portion of the electron beam generating array to selectively provide a second electron beam energy to the chemical species in a second region of the semiconductor surface;
   wherein the first electron beam energy interacts with the chemical species to form an etching species, and the second electron beam energy interacts with the chemical species to deposit a coating in the second region.

2. The method of claim 1, wherein the first electron beam energy interacts with the chemical species to form a species to etch silicon oxide, and the second electron beam energy interacts with the chemical species to deposit a coating on silicon.

3. The method of claim 1, wherein activating a portion of the electron beam generating array includes activating a portion of a carbon nanotube array.

4. The method of claim 1, wherein introducing the chemical species includes introducing a gas to a semiconductor surface.

5. The method of claim 4, wherein introducing the gas includes introducing a gas with molecules that include both a halogen and carbon.

6. The method of claim 1, wherein introducing the chemical species includes introducing a plasma to a semiconductor surface.

7. The method of claim 1, wherein depositing the coating in the second region includes depositing a carbon containing coating.

8. A method of semiconductor processing, comprising:
   introducing a gas to a semiconductor surface within a processing chamber;
   activating a carbon nanotube emitter to generate an electron beam;
   exposing the gas and the semiconductor surface to the electron beam;
   at least partially dissociating the gas to form an etching species to react with a first region of the semiconductor surface;
   concurrently depositing a coating on a second region of the semiconductor surface; and
   concurrently imaging the surface using the electron beam as a scanning electron microscope.

9. The method of claim 8, wherein at least partially dissociating the gas to form the etching species includes at least partially dissociating the gas to form a halogen containing species.

10. The method of claim 9, wherein at least partially dissociating the gas to form the halogen containing species includes at least partially dissociating the gas to form a fluorine containing species.

11. The method of claim 8, wherein concurrently depositing the coating includes concurrently depositing a carbon containing coating.

12. The method of claim 8, wherein introducing the gas to the semiconductor surface includes introducing a gas with molecules that include both a halogen and carbon.

13. The method of claim 12, wherein introducing the gas to a semiconductor surface includes introducing $CHF_3$ gas to the semiconductor surface.

14. The method of claim 13, further including introducing a selected amount of $H_2$ gas to control a ratio of carbon to fluorine in the coating.

15. A method of forming a semiconductor memory device, comprising:
   processing a semiconductor surface to form a number of electronic structures including:
      forming a number of memory cells on a semiconductor surface;
      forming circuitry to couple the number of memory cells together;
   wherein processing a semiconductor surface includes:
      introducing a chemical species to a semiconductor surface within a processing chamber;
      activating a first portion of an electron beam generating array to selectively provide a first electron beam energy to the chemical species in a first region of the semiconductor surface;
      activating a second portion of the electron beam generating array to selectively provide a second electron beam energy to the chemical species in a second region of the semiconductor surface;
      wherein the first electron beam energy interacts with the chemical species to form an etching species, and the second electron beam energy interacts with the chemical species to deposit a coating in the second region.

16. The method of claim 15, wherein the first electron beam energy interacts with the chemical species to form a species to etch silicon oxide, and the second electron beam energy interacts with the chemical species to deposit a coating on silicon.

17. The method of claim 15, wherein activating a portion of the electron beam generating array includes activating a portion of a carbon nanotube array.

18. The method of claim 15, wherein introducing the chemical species to the semiconductor surface includes introducing a chemical species with molecules that include both a halogen and carbon.

19. The method of claim 18, wherein introducing the chemical species to a semiconductor surface includes introducing $CHF_3$ to the semiconductor surface.

20. A method of forming an electronic system, comprising:

processing a semiconductor surface to form a semiconductor memory having a number of electronic structures including:

forming a number of memory cells on the semiconductor surface;

forming circuitry to couple the number of memory cells together;

wherein processing the semiconductor surface includes:

introducing a chemical species to a semiconductor surface within a processing chamber;

activating a first portion of an electron beam generating array to selectively provide a first electron beam energy to the chemical species in a first region of the semiconductor surface;

activating a second portion of the electron beam generating array to selectively provide a second electron beam energy to the chemical species in a second region of the semiconductor surface;

wherein the first electron beam energy interacts with the chemical species to form an etching species, and the second electron beam energy interacts with the chemical species to deposit a coating in the second region; and coupling a controller to the semiconductor memory.

21. The method of claim 20, wherein coupling a controller to the semiconductor memory includes coupling a personal computer processor to the semiconductor memory.

22. The method of claim 20, wherein forming the number of memory cells on the semiconductor surface includes forming a number of flash memory cells on the semiconductor surface.

23. The method of claim 20, wherein introducing the gas to the semiconductor surface includes introducing a gas with molecules that include both a halogen and carbon.

24. The method of claim 23, further including introducing a selected amount of scavenger gas to remove halogen species and control a ratio of carbon to halogen in the coating.

* * * * *

UNITED STATES PATENT AND TRADEMARK OFFICE
CERTIFICATE OF CORRECTION

PATENT NO. : 7,718,080 B2  Page 1 of 1
APPLICATION NO. : 11/503690
DATED : May 18, 2010
INVENTOR(S) : Neal R. Rueger et al.

It is certified that error appears in the above-identified patent and that said Letters Patent is hereby corrected as shown below:

On the Title page, item (54), in "Title", in column 1, line 1, delete "ELECTRONIC" and insert -- ELECTRON --, therefor.

In column 1, line 1, delete "ELECTRONIC" and insert -- ELECTRON --, therefor.

Signed and Sealed this

Twentieth Day of July, 2010

David J. Kappos
*Director of the United States Patent and Trademark Office*